United States Patent [19]
Parker et al.

[11] Patent Number: 5,840,420
[45] Date of Patent: Nov. 24, 1998

[54] MAGNETORESISTANCE ELEMENTS EXHIBITING THERMALLY STABLE GIANT MAGNETORESISTANCE EFFECT

[75] Inventors: Martin R. Parker, Tuscaloosa, Ala.; Syed A. Hossain, Fremont, Calif.

[73] Assignee: The University of Alabama, Tuscaloosa, Ala.

[21] Appl. No.: 619,350

[22] Filed: Mar. 21, 1996

[51] Int. Cl.⁶ .................. G11B 5/66; B32B 5/16
[52] U.S. Cl. .............. 428/332; 428/336; 428/693; 428/694 R; 428/694 T; 428/694 TS; 428/694 TM; 428/900; 427/127; 427/128; 427/129; 427/130; 427/131
[58] Field of Search .............. 428/693, 694 R, 428/694 T, 694 TS, 694 TM, 900, 332, 336; 427/127, 128, 129, 130, 137

[56] References Cited

U.S. PATENT DOCUMENTS 5,510,172  4/1996  Araki ........................... 428/213
5,514,452  5/1996  Araki ........................... 428/213
5,514,469  5/1996  Shinjo .......................... 428/332
5,521,005  5/1996  Kitada .......................... 428/332
5,549,977  8/1996  Jin ............................. 428/692
5,549,978  8/1996  Iwasaki ........................ 428/692
5,585,196  12/1996 Inomata ........................ 428/557

*Primary Examiner*—Leszek Kiliman
*Attorney, Agent, or Firm*—Oblon, Spivak, McClelland, Maier & Neustadt, P.C.

[57] ABSTRACT

Magnetoresist elements having good giant magnetoresistance characteristics of at least 6 percent are prepared by depositing alternating layers of magnetic alloy and non-magnetic copper or copper alloys in a thickness of 22–40 angstroms, which element, as deposited, exhibits ferromagnetic coupling. The multi-layer element, which may include up to 20 bilayers of magnetic material/non-magnetic material is then annealed at a temperature of about 250°–325° C. for a period of at least 15 minutes up to 10 hours. The resulting element exhibits good GMR characteristics which are thermally stable, and insensitive to minor variations in the thickness of the non-magnetic layer.

6 Claims, 2 Drawing Sheets

MAGNETORESISTANCE ELEMENTS EXHIBITING THERMALLY STABLE GIANT MAGNETORESISTANCE EFFECT

BACKGROUND OF THE INVENTION

1. Field of the Invention

This invention pertains to a magnetoresist element exhibiting giant magnetoresistance effect (GMR). Specifically, this application is directed to multi-layer elements exhibiting substantial GMR, which GMR characteristics are not exhibited upon deposition of the layers, but are exhibited after heat treatment, and are stable with respect to temperatures up to 300° C. The invention also addresses methods of preparing these magnetoresistance elements.

2. Background of the Prior Art

Magneto resistance elements, exhibiting GMR, have been studied as candidates for ultra high density heads in the data storage industry, and in particular, are contemplated in the fabrication of magnetic thin film sensors, read heads for hard disks and tape systems, and magnetoresistive random access memory arrays. Typical devices described in prior art publications address multi-layer stacks of alternating ferromagnetic and non-ferromagnetic material, wherein the ferromagnetic material in any two adjacent layers, separated by a non-magnetic layer, is either ferromagnetically coupled, or anti-ferromagnetically coupled. For high GMR characteristics (above about 6%) anti-ferromagnetic coupling is generally desired.

Exemplary discussions of this type of prior art device appear in Speriosu, et al. Phys. Rev. 47:11578–11582 (1993); Smith, IEEE Trans. Magn. 30:3823–3824 (1994) and Dieny, J. Magn. Magn. Mater. 136:335–359 (1994). Typically, these prior art devices will comprise 10–20 or more alternating stacked layers in a single magnetoresistance element. Typical magnetic materials include NiFeCo alloys, FeCo alloys and the like. The alloys are well known in the prior art, and do not constitute an aspect of the invention. Similarly, non-magnetic spacer materials, such as silver, gold and copper or copper alloys are well known to those of skill in this art.

Magnetoresist elements exhibiting good GMR characteristics have been plagued by a number of significant problems. Among the most serious is the thermal instability of the high GMR properties. When the multi-layer elements of the prior art are heated to temperatures above 200° C., particularly above 250° C., the GMR properties tend to degrade. Fabrication of most devices involving the application of these elements requires thermal processing of materials at temperatures in excess of 200° C., on up to about 300° C. Clearly, thermal stability of the high GMR characteristics is a critical requirement. Thermal stability has been achieved, to some extent, in a different sort of multi-layer structure, that is, a 4-layer series: NiFeCo/Cu/Co/Cu, but the GMR characteristics are worse (much lower) than that of conventional structures. Satomi et al., J. Magn. Magn. Mater. 126:504 (1993).

Another problem plaguing those of skill in the art involved in the preparation of high GMR magnetoresist elements is the difficulty in establishing appropriate thicknesses for both the magnetic layer and the non-magnetic layer. Typically, in prior art preparations, the thickness of the magnetic layer is disclosed to be between about 0–50 angstroms, and generally optimized to about 21 angstroms in multi-layers involving more than a simple trilayer. These multi-layers show good GMR characteristics upon deposition, while multi-layers with significantly thicker magnetic layers (greater than about 22 angstroms) show poor GMR characteristics, below about 2%. GMR characteristics are also highly sensitive to Cu spacer thickness, with deviations from the established standard (21 angstroms) of as much as 2 angstroms causing a substantial loss of GMR characteristics. While the deposition techniques available for the formation of these layers is in fact equal to the task of controlling thickness, variations of as much as one angstrom can be expected, and the cost of maintaining quality control beyond that level is significant.

Accordingly, it remains an object of those skill in the art to prepare magnetoresist elements that have high thermal stability, to temperatures up to 300° C., in terms of good GMR characteristics, which characteristics are not sensitive to variations of 1–2 angstroms in the non-magnetic spacer layer.

SUMMARY OF THE INVENTION

The above objects, and other objects made more clear by the disclosure set forth below, are achieved by forming a multi-layer stack of ferromagnetic/non-magnetic materials, with a thickness in the ferromagnetic materials in excess of that commonly employed in the prior art, such that the stack, as deposited, shows little or no GMR characteristic. The stack, as formed, is then heated at a temperature of about 300° C. in an inert atmosphere, or in a vacuum. Where the magnetic layer (NiFeCo, NiC, or FeCo alloy) is of a thickness of 22–40 angstroms, with a similar thickness for a copper spacer layer, the multi-layer, as deposited, lacks significant (i.e.,<2%) GMR. Upon annealing at 300° C., however, high GMR (at least 6% and in some instances as high as 18%) is exhibited, which high GMR is stable upon subsequent exposures to temperatures in the region of 300° C., and which is relatively insensitive to minor variations (up to one order of magnitude) in the thickness of the Cu spacer layers, but for which, a true optimum copper thickness is found.

The duration of the annealing process will vary depending on the specific alloy composition selected, and the number of layers in the stack. Typically, an annealing process of 15 min.–10 hours is contemplated in a temperature range 250° C. to 325° C.

DETAILED DESCRIPTION OF THE INVENTION

Figure 1A:
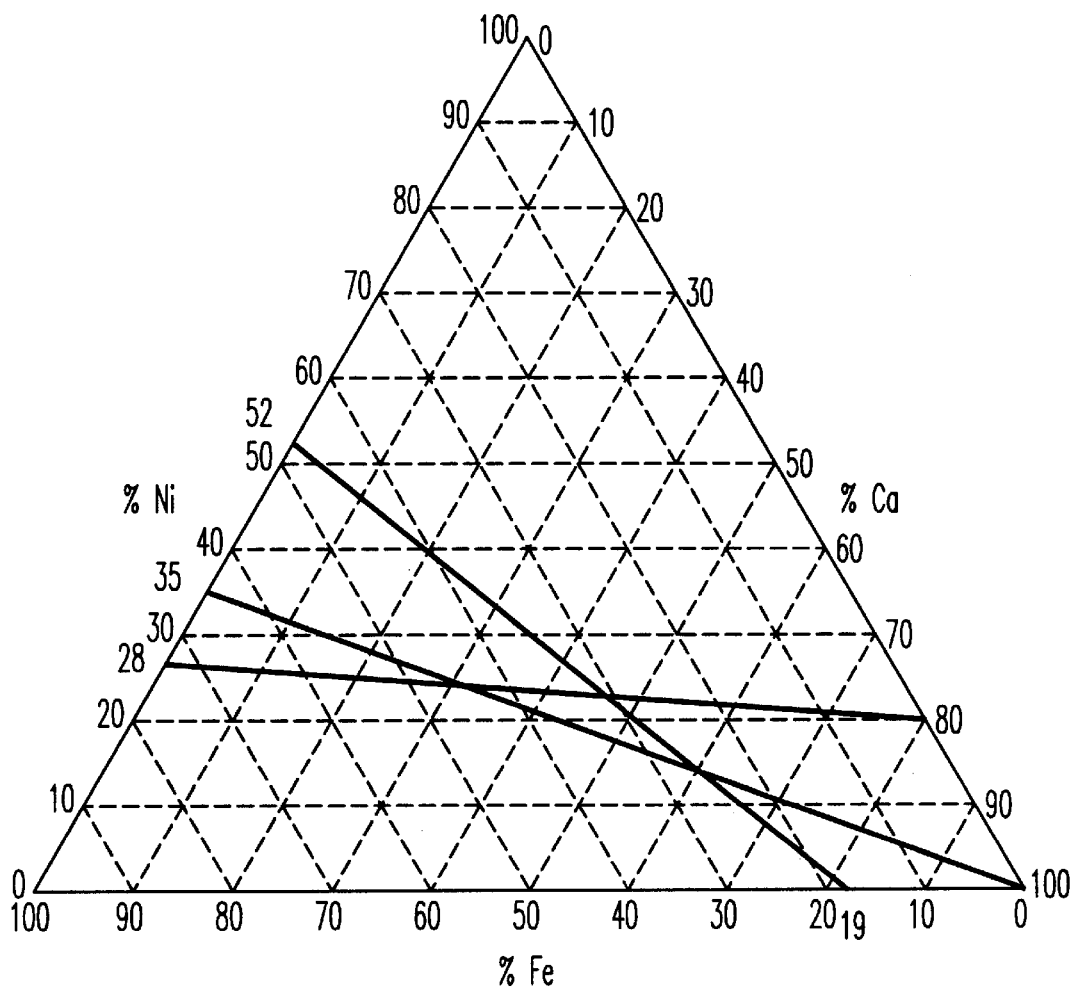
FIG. 1 reflects the range of binary and ternary magnetic alloys suitable for use in the claimed invention, corresponding to the darkened area FIG. 1a. The three lines for binary alloys which define the lower limit of the shaded area are set forth in FIG. 1b.

The multi-layer element of this invention is prepared using conventional technology. Thus, a multi-layer stack is prepared, with either a layer of copper, or copper-rich alloy, as a non-magnetic spacer layer, or a magnetic alloy of NiFeCo or FeCo composition, deposited onto a substrate or buffer layer, followed by alternating depositions of the other material (copper or copper-rich alloy spacer if the magnetic alloy is deposited, or vice-versa) until a stack of appropriate size is prepared. The effects of the claimed invention have been demonstrated for stacks as simple as two magnetic layers coupled across a single spacer layer, up to 20 bi-layer stacks, wherein paired copper or copper alloy/magnetic alloy layers constitutes a single bi-layer. Thus, a 20 bi-layer stack actually contemplates 40 layers of material. The techniques and conditions for the deposition of such materials have been well described in the literature, see, e.g., Parker et al., IEEE Trans. Magn. MAG-30, 358 (1994) and Hossain et al., J. Appl. Phys. 75:7067 (1994).

The thickness of each layer of the multi-layer stack is in excess of 21 angstroms, preferably less than 50 angstroms, and most preferably, between 23–40 angstroms, a range over which the effects of the invention can be obtained. Multi-layer stacks, with layers of the described thickness, appear to exhibit behavior almost opposite to those conventionally prepared, that is, having a thickness about 21 angstroms or less. These conventional elements prepared from thinner layers exhibit excellent GMR characteristics depending on the number of layers formed, in the as-deposited stated. Adjacent magnetic layers are anti-ferromagnetically coupled in the as-deposited state. Annealing at a temperature of about 300° C. for a relatively short period of time of 30 minutes rapidly degrades the GMR characteristics of these samples.

In contrast, the inventive elements, with thicknesses above 21 angstroms, and particularly, 23–40 angstroms, show little (<2%) or no GMR characteristic as deposited, exhibiting ferromagnetic coupling between adjacent magnetic layers. Upon heating at a temperature of at least 250° C. up to 325° C. for at least 15 minutes, good to excellent GMR characteristics are obtained (above 6% GMR, on up to as much as 12% GMR) although improvements in GMR characteristics are obtained for shorter anneal times. Thus, on annealing, the sign of the coupling changes from ferromagnetic to anti-ferromagnetic coupling. Importantly, these good to excellent GMR characteristics are maintained and stable with respect to temperatures up to 300° C., thus permitting use under conditions necessary for preparation of the devices described above. Also importantly, the copper spacing layers for GMR in the present invention may be 1 to 2 angstroms less in thickness than that producing optimum GMR in the as-deposited state.

It should be noted that the specific composition of the magnetic alloy is not critical, and similarly, the composition of the copper is not an aspect of the claimed invention. Indeed, multi-layer assemblies using magnetic layers of slightly different composition may be employed, if desired. In the event differing compositions are used in multi-layer assemblies, ideal layer thicknesses for each composition may be determined by empirical analysis.

Figure 1B:
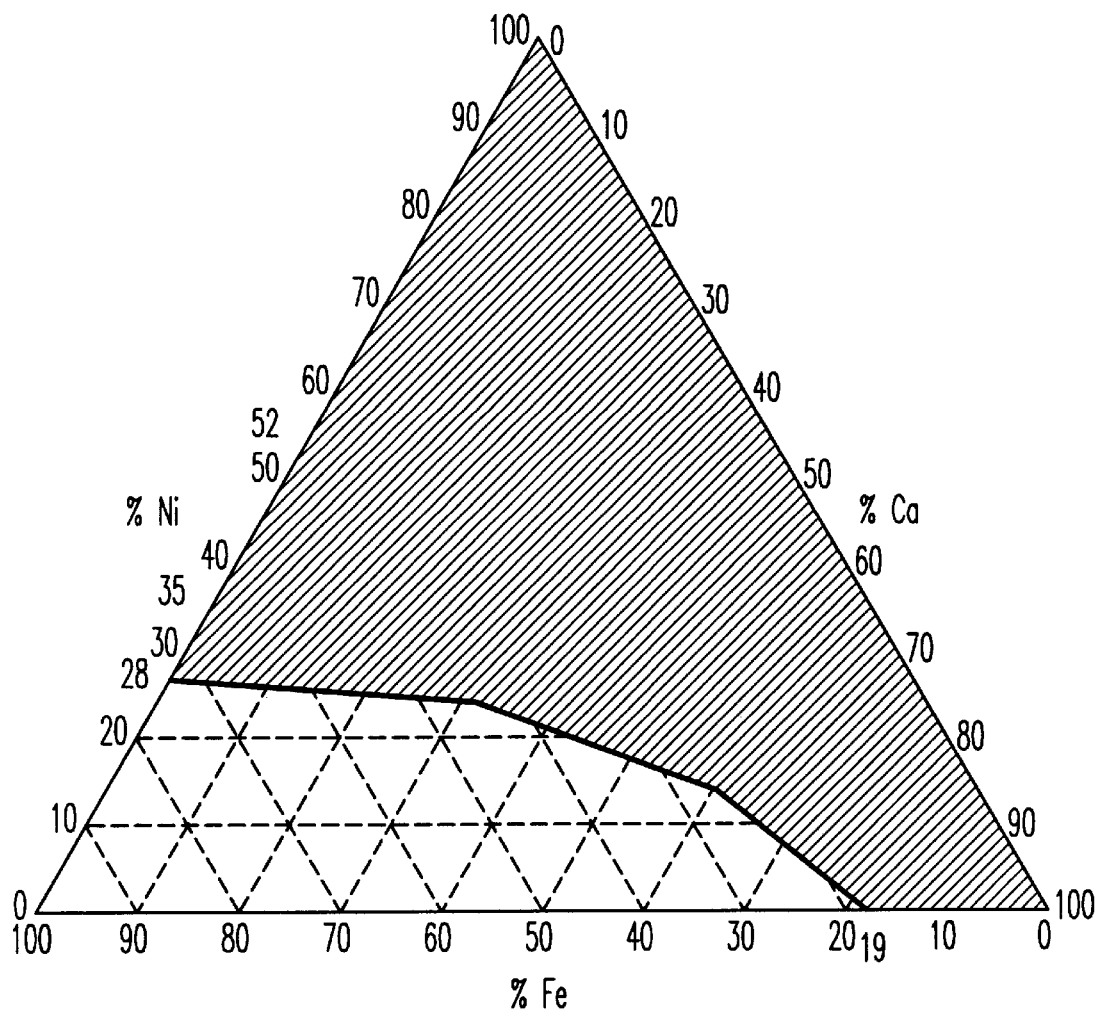

In general, however, the alloy should be a ternary (NiFeCo) or binary alloy (NiFe, NiCo, CoFe) lying within the shaded area of the Fe, Ni, Co phase diagram (see FIG. 1) which leads to face-centered cubic (fcc) crystallographically-structured magnetic layers. The area is defined in terms of the three lines giving (fcc) structure, that is 19% Co, 52% Ni, 100° Co, 35% and 30° Co, 28% Ni.

The above invention has been described in both generic terms, and by specific embodiment. Alternatives to the specific embodiments described, which are not intended as limiting, will occur to those of ordinary skill in the art, without the exercise of inventive faculty. In particular, the precise composition of the alloys selected, and the specific thickness of each layer, within the general parameters given, remain selections which can be varied with routine skill, save as excluded by the claims set forth below.

What is claimed is:

1. A magnetoresistive element exhibiting giant magnetoresistive characteristics (GMR), comprising alternating layers of (1) a magnetic alloy selected from the group consisting of NiFeCo, NiCo, FeCo and mixtures thereof, and (2) Cu, wherein said element comprises at least two layers of said magnetic alloy which are anti-ferromagnetically coupled, and wherein said GMR characteristics are stable at a temperature of up to 300° C. wherein said magnetic alloy layers have a thickness of 23–40 angstroms.

2. The composition of claim 1, wherein said copper has a thickness of 21–42 angstroms.

3. The element of claim 1, wherein said GMR is at least 6 percent.

4. A method of making a magnetoresistive element exhibiting GMR stable at temperatures of up to about 300° C., comprising: depositing alternating layers of a magnetic alloy selected from the group consisting of NiFeCo, NiCo, FeCo and mixtures thereof in alternation with layers of Cu, wherein the magnetic layers are ferromagnetically coupled across said non-magnetic layer as deposited, annealing said deposited element at a temperature of at least 250° C. in an inert atmosphere or vacuum, until said element exhibits GMR of at least 6 percent.

5. The process of claim 4, wherein said annealing step continues for a period of 15 minutes–10 hours.

6. The process of claim 4, wherein each said layer of said element has a thickness in the range of 22–40 angstroms.

* * * * *